United States Patent
Yehle et al.

(10) Patent No.: US 10,338,131 B2
(45) Date of Patent: Jul. 2, 2019

(54) SYSTEM AND METHOD FOR HIGH VOLTAGE STRESS TESTING PLURALITY OF PARALLEL UNITS

(71) Applicant: Texas Instruments Incorporated, Dallas, TX (US)

(72) Inventors: Joseph Milton Yehle, Dallas, TX (US); Xu Gao, Plano, TX (US); L Rene' Graves, Prosper, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 423 days.

(21) Appl. No.: 14/950,922

(22) Filed: Nov. 24, 2015

(65) Prior Publication Data

US 2017/0146565 A1   May 25, 2017

(51) Int. Cl.
| | |
|---|---|
| *G01R 31/00* | (2006.01) |
| *G01R 31/02* | (2006.01) |
| *G01R 31/28* | (2006.01) |
| *H01L 21/44* | (2006.01) |
| *H01L 21/66* | (2006.01) |
| *G01R 31/12* | (2006.01) |

(52) U.S. Cl.
CPC ..... *G01R 31/2863* (2013.01); *G01R 31/1227* (2013.01)

(58) Field of Classification Search
CPC ...... G01R 31/00; G01R 31/02; G01R 31/003; G01R 31/28; H01L 21/44; H01L 21/66
See application file for complete search history.

(56) References Cited

U.S. PATENT DOCUMENTS

| | | | | |
|---|---|---|---|---|
| 4,433,886 A * | 2/1984 | Cassarly | ............... | H01L 23/552 257/E23.114 |
| 5,006,792 A * | 4/1991 | Malhi | .................. | G01R 1/0483 257/48 |
| 5,572,140 A * | 11/1996 | Lim | ...................... | G01R 1/0483 324/750.05 |
| 5,990,692 A * | 11/1999 | Jeong | ................. | G01R 31/2886 324/754.08 |
| 6,696,848 B2 * | 2/2004 | Robinson | ............. | G01R 1/0433 324/756.02 |
| 7,749,014 B2 * | 7/2010 | Chiang | ................... | H01L 23/32 439/331 |
| 7,977,961 B2 * | 7/2011 | Koizumi | ........... | G01R 31/2863 324/756.07 |
| 2002/0025603 A1 * | 2/2002 | Ondricek | ............. | G01R 1/0408 438/117 |
| 2009/0137070 A1 * | 5/2009 | Co | ......................... | G11C 29/06 438/17 |
| 2011/0057565 A1 * | 3/2011 | Makarov | ................ | H01J 3/021 315/111.81 |

(Continued)

*Primary Examiner* — Neel D Shah
(74) *Attorney, Agent, or Firm* — Ronald O. Neerings; Charles A. Brill; Frank D. Cimino

(57) ABSTRACT

A system has a chip mounting board and a docking board. The chip mounting board can be loaded with test samples in a low voltage environment and can then be transported to a high voltage environment. The chip mounting board can be connected to the docking board and allows high voltage testing of multiple samples in parallel. The chip mounting board can then be disconnected from the docking board and transported back to a low voltage environment to unload the tested samples.

29 Claims, 7 Drawing Sheets

(56) References Cited

U.S. PATENT DOCUMENTS

2013/0229190 A1* 9/2013 Su ........................... H01L 22/34
                                                        324/537
2014/0278196 A1* 9/2014 Eng ................... G01R 31/2894
                                                        702/117

* cited by examiner

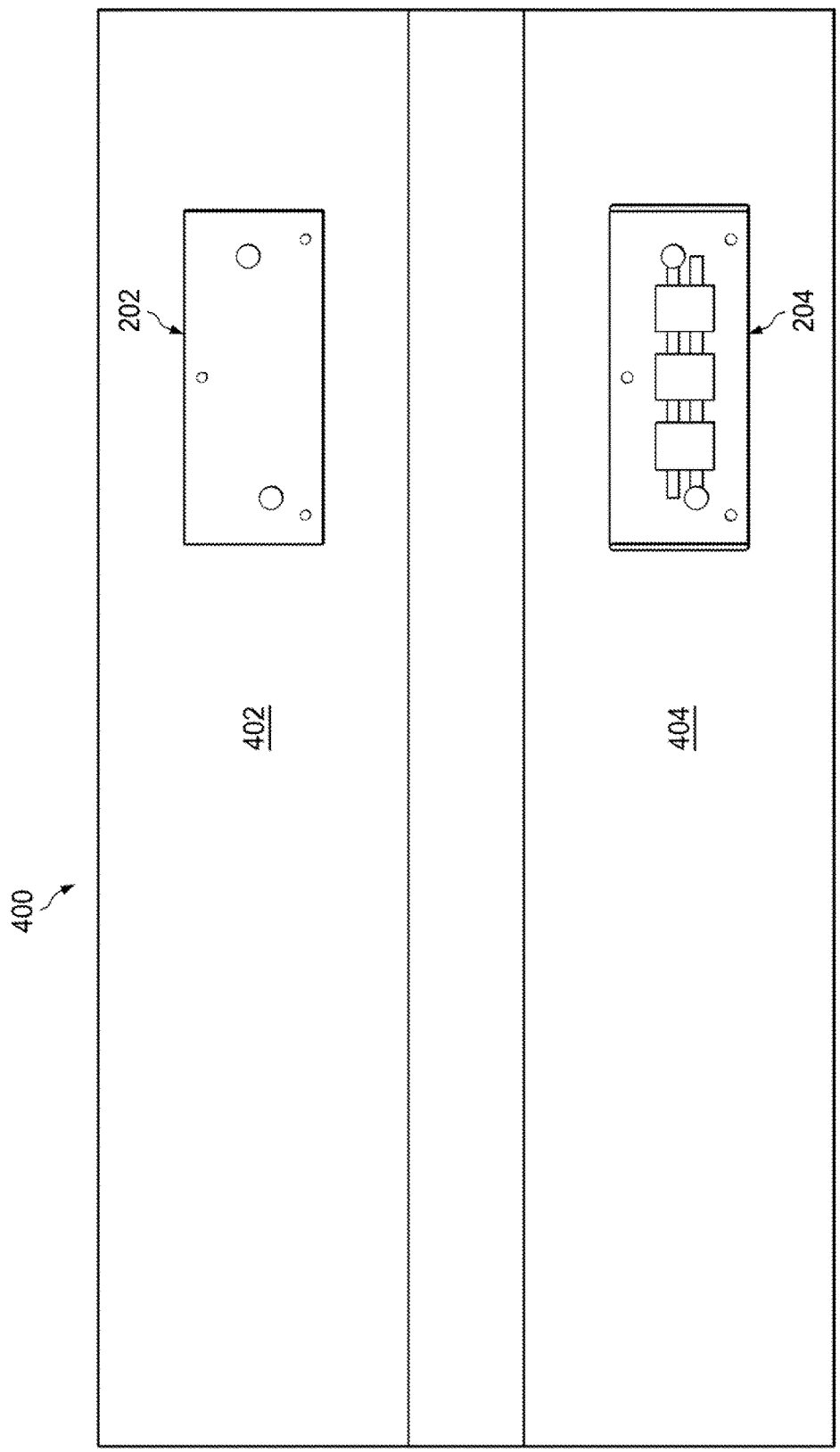

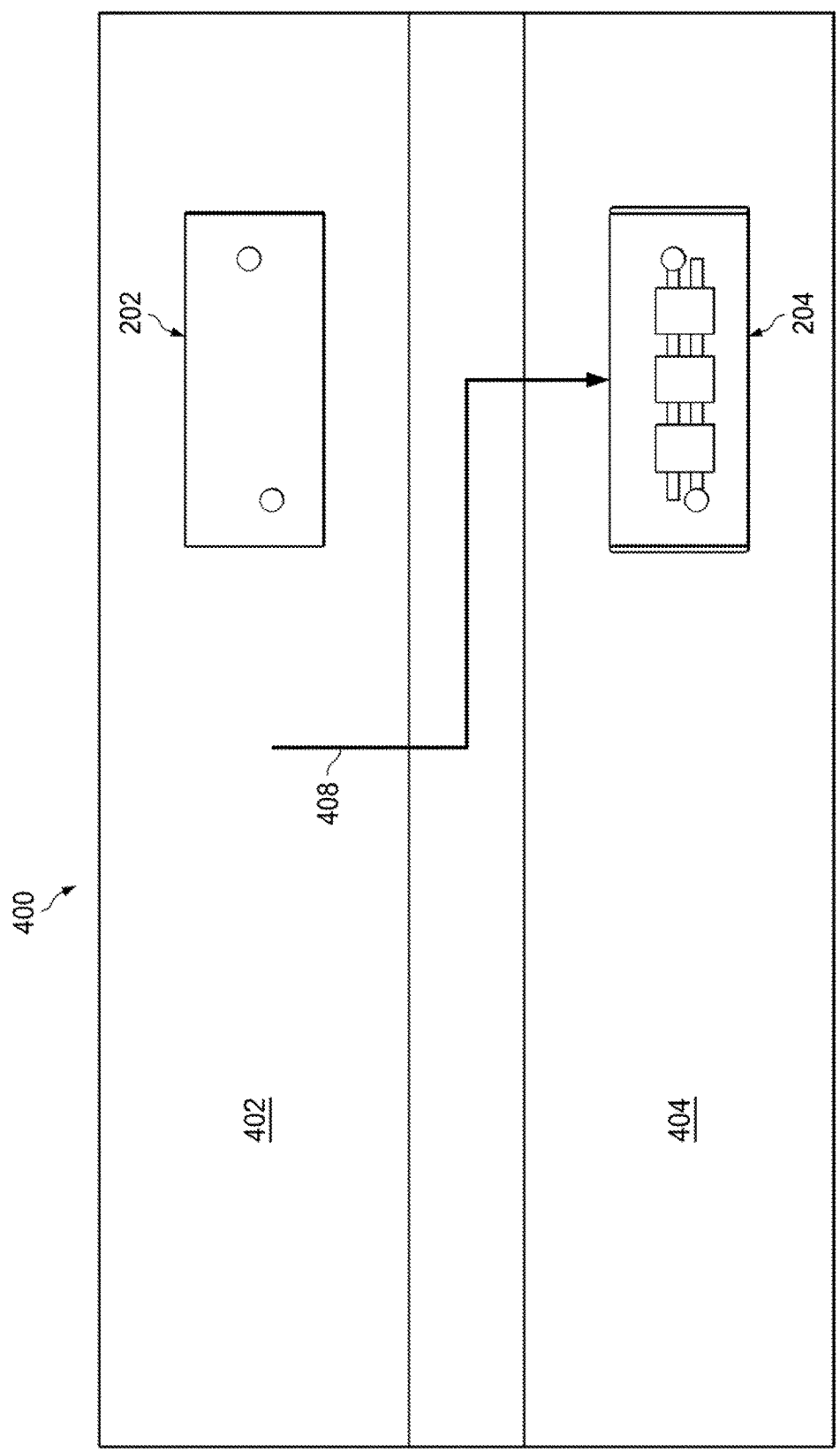

SYSTEM AND METHOD FOR HIGH VOLTAGE STRESS TESTING PLURALITY OF PARALLEL UNITS

BACKGROUND

The invention generally deals with systems and methods for loading and unloading multiple samples to be tested in a high voltage environment using a two piece test fixture.

Today, electronic devices are stringently tested in a production cycle; two of these tests are electrical surge and Accelerated Dielectric Testing (ADS). Typically devices will not be operated under the extreme conditions present in the surge and ADS tests, but devices may experience these conditions on occasion. Such occasions include lightning strikes, downed power lines, or the operation of high power equipment and utilities.

When an electronic device is exposed to extreme conditions, it is important that the device operates normally afterwards. The surge and ADS tests recreate extreme conditions that electronic devices may be exposed to during their lifetime. After completion of the tests, it is determined whether a tested sample suffered a breakdown and no longer operates as intended.

ADS testing is the application of a high voltage AC stress to accelerate the wear out of the isolation barrier and package. For example, one testing standard for ADS requires 5.7 kV to be applied for 64 hours. Surge testing is the application of 50 high voltage pulses designed to break the isolation barrier of a sample.

Surge and ADS both require a large voltage for testing, which presents additional difficulties. In many electrostatic discharge (ESD) environments, various measures are taken to reduce electrostatic discharges that may damage the samples under testing at low voltages.

Many ESD environments implement measures to reduce electro-static discharges such as a grounded floor, grounded wrist straps, and discharge mats to allow any electrostatic build up to be dissipated safely.

The problem with surge and ADS testing is that the large voltages required will be discharged to ground through a person handling the samples, via the ES safety measures, leading to shock or electrocution. For this reason, standard ESD safety measures are not an option when performing ADS and surge testing. The lack of safety measures protects the operator, but leaves the samples under testing susceptible to smaller electrostatic discharges that may occur during the handling and transportation of the samples.

FIG. 1 illustrates a conventional surge test system 100.

As illustrated in the figure, system 100 includes a chip mounting area 102, and a chip 104.

Chip mounting area 102 is arranged such that when chip 104 is mounted, the input of chip 104 is connected to input line 106 and the output of chip 104 is connected to output line 108.

Chip 104 is operable to receive an input, via input line 106, and convert it into an output. Chip 104 is additionally operable to transmit the output, via output line 108.

In operation, an operator will be instructed to perform a high voltage surge test on chip 104. At this point the operator will mount chip 104 in chip mounting area 102. Chip mounting area 102 is located in a high voltage area where ESD safety measures such as grounded flooring, grounded wrist straps, and discharge mats cannot be used. Due to the lack of these safety measures, there is the possibility that chip 104 may be damaged by an electrostatic discharge.

After chip 104 is mounted, the operator begins the high voltage surge test. During the test, a plurality of high voltage signals are input to chip 104, via input line 106. The high voltage signals pass through chip 104 and are then transmitted to ground, via output line 108. Each output signal can then be analyzed to detect a breakdown in the isolation barrier of chip 104.

Performing surge testing in this manner requires that one chip be tested at a time. Surge testing requires the output signal to be analyzed, so testing multiple chips in parallel is not performed since the output of multiple samples would be superimposed into a single signal. The superposition of multiple signals into a single output signal prevents an operator from being able to identify the specific device sample that failed.

A problem with the current system and method for performing surge testing is that testing multiple chips prevents failure identification. The inability to test multiple samples is problematic in a production environment which requires a large number of samples to be tested fir quality control purposes.

Another problem with the current system and method for performing surge and ADS testing is that standard safety measures used to protect people and testing samples in a low voltage ESD environment are quite dangerous in a high voltage ESD environment.

Accordingly, for at least the foregoing reasons there exists a need for performing surge testing of multiple samples while simultaneously discharging electrostatic build up safely.

SUMMARY

The invention is drawn to a system and method for using a two piece test fixture to load and unload a plurality of testing samples that can be tested in parallel.

An aspect of the invention is drawn to a system that includes a chip mounting board and a docking board. Test samples are loaded on the chip mounting board in a low voltage environment with ESD protective measures implemented. Once loaded, the chip mounting board can be transported to a high voltage environment where the docking board is located. Once in the high voltage environment, the chip mounting board can be attached to the docking board and testing can then be performed. After testing, the chip mounting board can be detached from the docking board and transported back to the low voltage environment.

Various embodiments described herein are drawn to a system that has a chip mounting board and a docking board. The chip mounting board can be loaded with test samples in a low voltage environment and can then be transported to a high voltage environment. The chip mounting board can be connected to the docking board and allows high voltage testing of multiple samples in parallel. The chip mounting board can then be disconnected from the docking board and transported back to a low voltage environment to unload the tested samples.

BRIEF SUMMARY OF THE DRAWINGS

The accompanying drawings, which are incorporated in and form a part of the specification, illustrate an exemplary embodiment of the invention and, together with the description, serve to explain the principles of the invention. In the drawings:

FIGS. 4A-C illustrates a method of operating the testing device of FIG. 2 in accordance with aspects of the invention.

DETAILED DESCRIPTION

Figure 1:
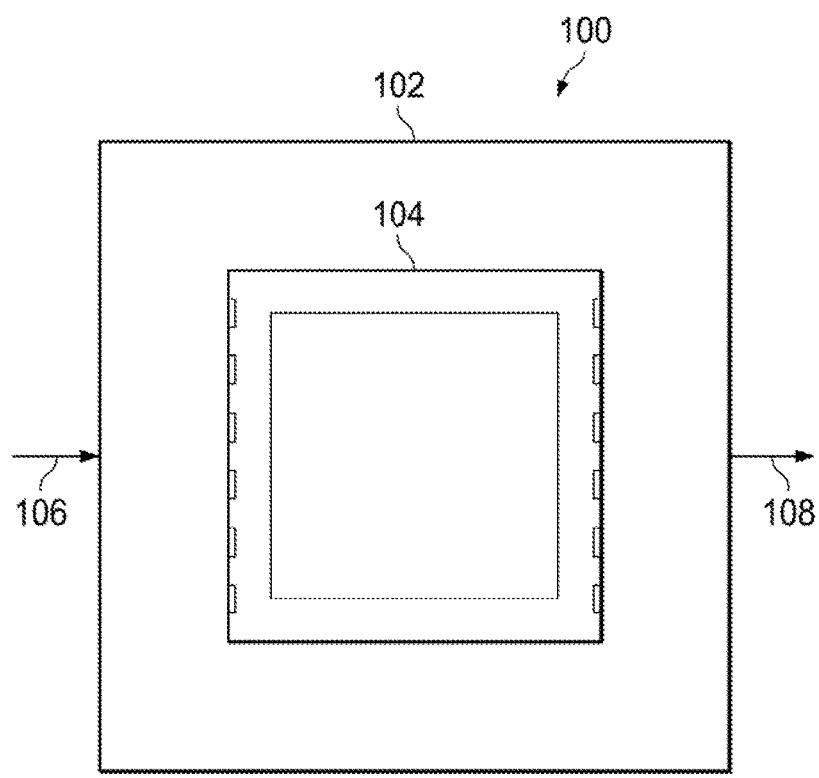
FIG. 1 illustrates a conventional testing system.

Aspects of the invention are drawn to a system and method for using a two piece test fixture to support multi-unit parallel ADS and surge testing while meeting high voltage ESD safety requirements.

In accordance with a first aspect of the invention, multi-unit surge testing is performed. During surge testing, a high voltage signal is passed through a sample. The input signals that are applied to a sample have a predetermined waveform. As the signal passes through the sample, any defects or break down in the isolation barrier will affect the shape of the waveform of the input signal. After passing through the sample, the signal is output to an oscilloscope which an operator can then use to analyze the waveform. If the waveform is unchanged, the isolation barrier of the sample is intact and passed the surge test, and if the waveform is changed, the isolation barrier has broken down and failed the surge test.

Since the output of a surge test is recorded and analyzed, parallel testing is not performed in today's testing laboratories. If parallel testing was performed, the outputs of each sample would be superimposed and any failure would be impossible to identify. The invention uses a chip mounting board with multiple sockets in addition to an input and output bus to perform parallel surge testing.

When the chip mounting boarded is loaded with multiple samples, each sample input is connected to an input bus and each output is connected to an output bus. When surge testing is performed, an input signal is delivered to each sample via the input bus, and each output signal is delivered to an oscilloscope via the output bus, The output bus allows each output signal to be kept separate and prevent signal superposition. Each signal can then be analyzed separately to determine if a sample passed or failed.

In accordance with a second aspect of the invention, a two piece testing fixture that includes a chip mounting board and a docking board is used to safely load/unload test samples during parallel ADS and surge testing.

The docking board is located in a high voltage environment and wired to the high voltage surge or ADS power supplies. The docking board contains non-symmetrical electrical and mechanical connectors allow the chip mounting board to be joined in a vertically stacked arrangement.

When an operator would like to perform either an ADS or surge test they will first take the chip mounting board to a low voltage environment. Once in the low voltage environment, the operator can place a plurality of samples on the chip mounting board using the sockets that are mechanically attached to the chip mounting board. Loading the chip mounting board in a low voltage environment means that safety measures such as grounded flooring, grounded wrist bracelets, and discharge mats can be used to prevent an electrostatic discharge that may damage the loaded units prior to testing.

After all of the samples are loaded on to the chip mounting board, the operator will transfer the chip mounting board from a low voltage environment to a high voltage environment by using the handles attached to the chip mounting board. The handles allow the board to be transported without an operator transferring skin oil and other contaminants to the chip mounting board.

Once in the high voltage environment, the operator can connect the chip mounting board to the docking board using the non-symmetrical electrical and mechanical connectors. Once connected, the operator may perform the surge or ADS testing. In this manner, testing samples can be loaded and unloaded by an operator in a manner that is safe for both the samples and the operator.

In accordance with a third aspect of the invention, a plurality of docking boards may be used to perform multiple tests in succession on a single set of samples. A separate docking board can be used for each test that needs to be performed on a set of samples. For example; if a set of samples must go through ADS testing and the surge testing, an operator can load the set of samples onto a chip mounting board in a low voltage environment.

After loading the samples, the operator may then connect the chip mounting board to a docking board that is wired for ADS testing. Once connected, the ADS test can be performed on the samples. After the test is complete, the operator can simply disconnect the chip mounting board from the docking board for ADS testing and then transport and connect it to the docking board for surge testing. Once connected, the operator can disconnect the chip mounting board and remove the samples in a low voltage environment.

Example systems in accordance with the first inventive aspect of the invention will now be described with reference to FIGS. 2-5.

Figure 2:
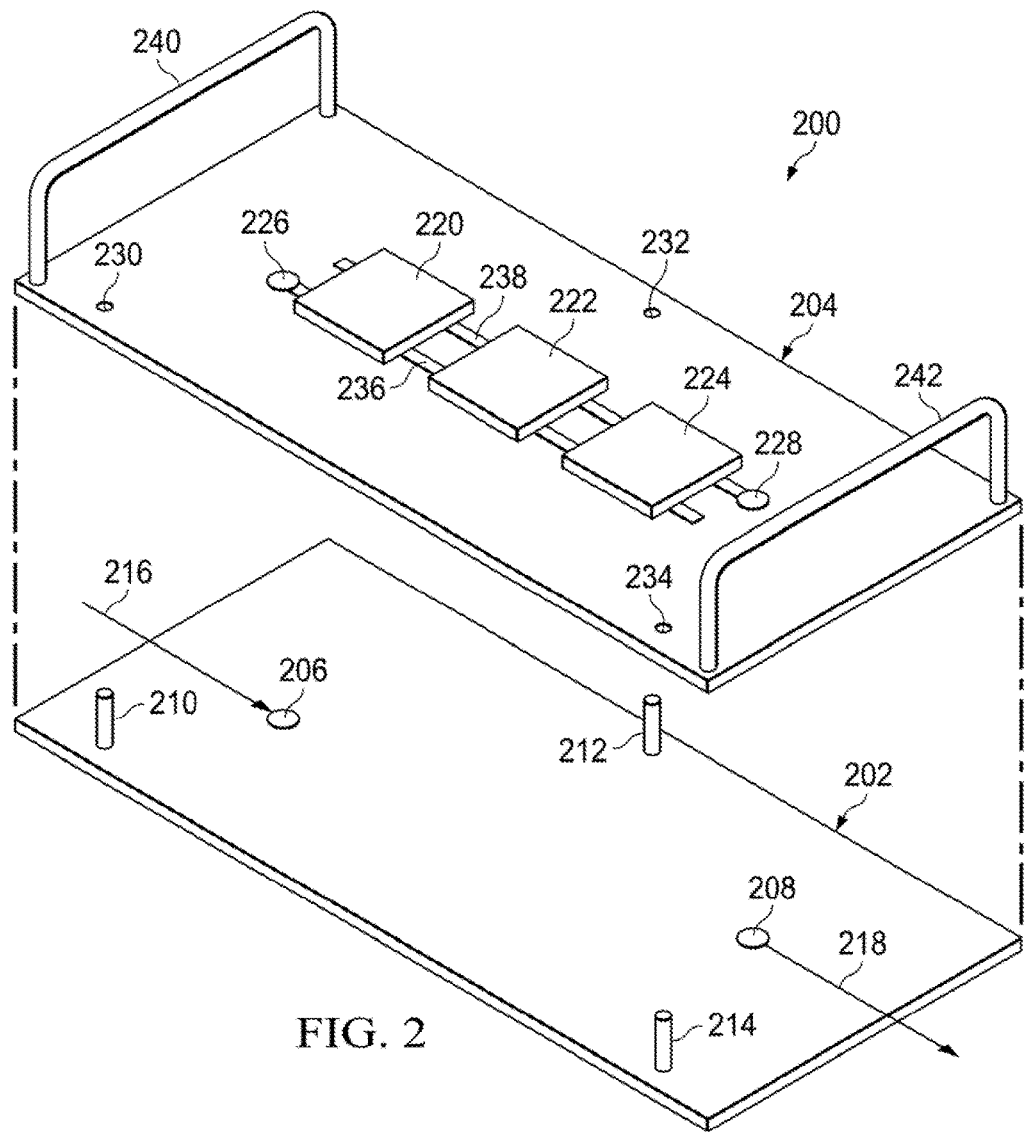
FIG. 2 illustrates a block diagram of a testing device in accordance with aspects of the invention.

FIG. 2 illustrates a block diagram 200 of a two piece test fixture in accordance with aspects of the invention.

As illustrated in the figure, block diagram 200 includes a docking board 202 and a chip mounting board 204. Docking board 202 further includes an input connector 206, an output connector 208, a mounting element 210, a mounting element 212, and a mounting element 214. Chip mounting board 204 includes a chip mounting area 220, a chip mounting area 222, a chip mounting area 224, an input port 226, an output port 228, a mounting port 230, a mounting port 232, a mounting port 234, an input bus 236, an output bus 238, a handle 240, and a handle 242.

Input connector 206 is operable to electrically connect to input port 226 of chip mounting board 204. Input connector 206 is additionally operable to receive an input, via an input line 216.

Many different inputs may be supplied to input connector 206, via input line 216, based on the specific test to be performed. Non-limiting examples of such tests include an input of 5.0 kV signal for a minimum of 40 hours or a plurality of voltage pulses, such as 25 positive pulses followed by 25 negative pulses.

Output connector 208 is operable to electrically connect to output port 228 of chip mounting board 204. Output connector 208 is additionally operable to output a signal, via an output line 218.

Mounting element 210 is operable to connect to mounting port 230, mounting element 212 is operable to connect to mounting port 232, and mounting element 214 is operable to connect to mounting port 234 of chip mounting board 204. Mounting element 210, mounting element 212, mounting element 214, mounting port 230, mounting port 232, and mounting port 234 may be any known system for removing and attaching chip mounting board 204 to docking board 202, non-limiting examples of which include clamping, parallel groove, piercing, two-bolt, split bolt, male-female, or post-hole connectors.

Each of mounting element 210, mounting element 212, and mounting element 214 are different distances from the end of docking board 202. Since each of mounting element 210, mounting element 212, and mounting board 214 are asymmetrically placed, chip mounting board can only be connected one way. This prevents chip mounting board 204 from being connected to docking board 202 backwards.

In this non-limiting example embodiment, there are three mounting element-mounting port pairs. It should be noted that any integer number greater than zero of mounting element-mounting port pairs by be used in accordance with aspects of the invention.

Chip mounting area 220 is operable to receive a first chip, chip mounting area 222 is operable to receive a second chip, and chip mounting area 224 is operable to receive a third chip. Each of chip mounting area 220, chip mounting area 222, and chip mounting area 224 are arranged such that when they receive chips, each chip is in parallel with input bus 236 and in parallel with output bus 238.

Input port 226 is operable to electrically connect to input connector 206 of docking board 202 and input bus 236. Input port 226 is additionally operable to deliver an input from input connector 206 to input bus 236.

Output port 228 is operable to electrically connect to output connector 208 of docking board 202 and output bus 238. Output port 228 is additionally operable to deliver an output signal from output bus 238 to output connector 208.

Mounting port 230 is operable to connect to mounting element 210, mounting port 232 is operable to connect to mounting element 212, and mounting port 234 is operable to connect to mounting element 214 of docking board 202.

Input bus 236 is operable to receive an input from input port 226 and deliver the input to an input portion of the chip of mounting area 220, the chip of mounting area 222, and the chip of mounting area 224.

Output bus 238 is operable to receive an output portion of the chip of mounting area 220, the chip of mounting area 222, and the chip of mounting area 224 and deliver the outputs to output port 228.

Handle 240 and handle 242 are operable to enable an operator to transport chip mounting board 204.

Figure 3:
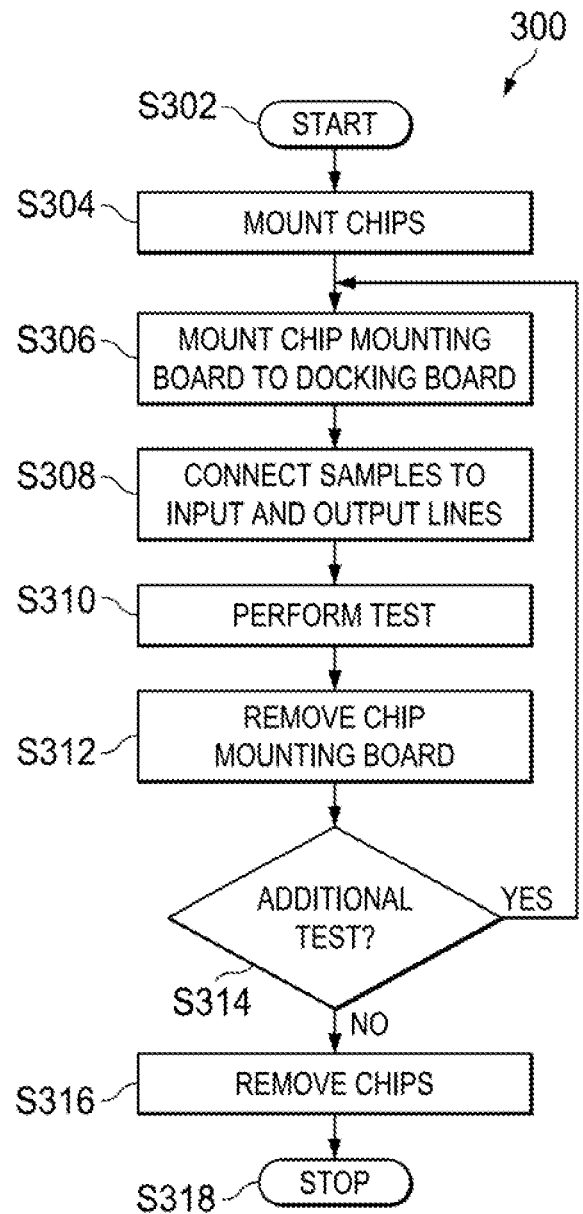
FIG. 3 illustrates a method of operating the testing device of FIG. 2 in accordance with aspects of the invention.
Figure 4B:
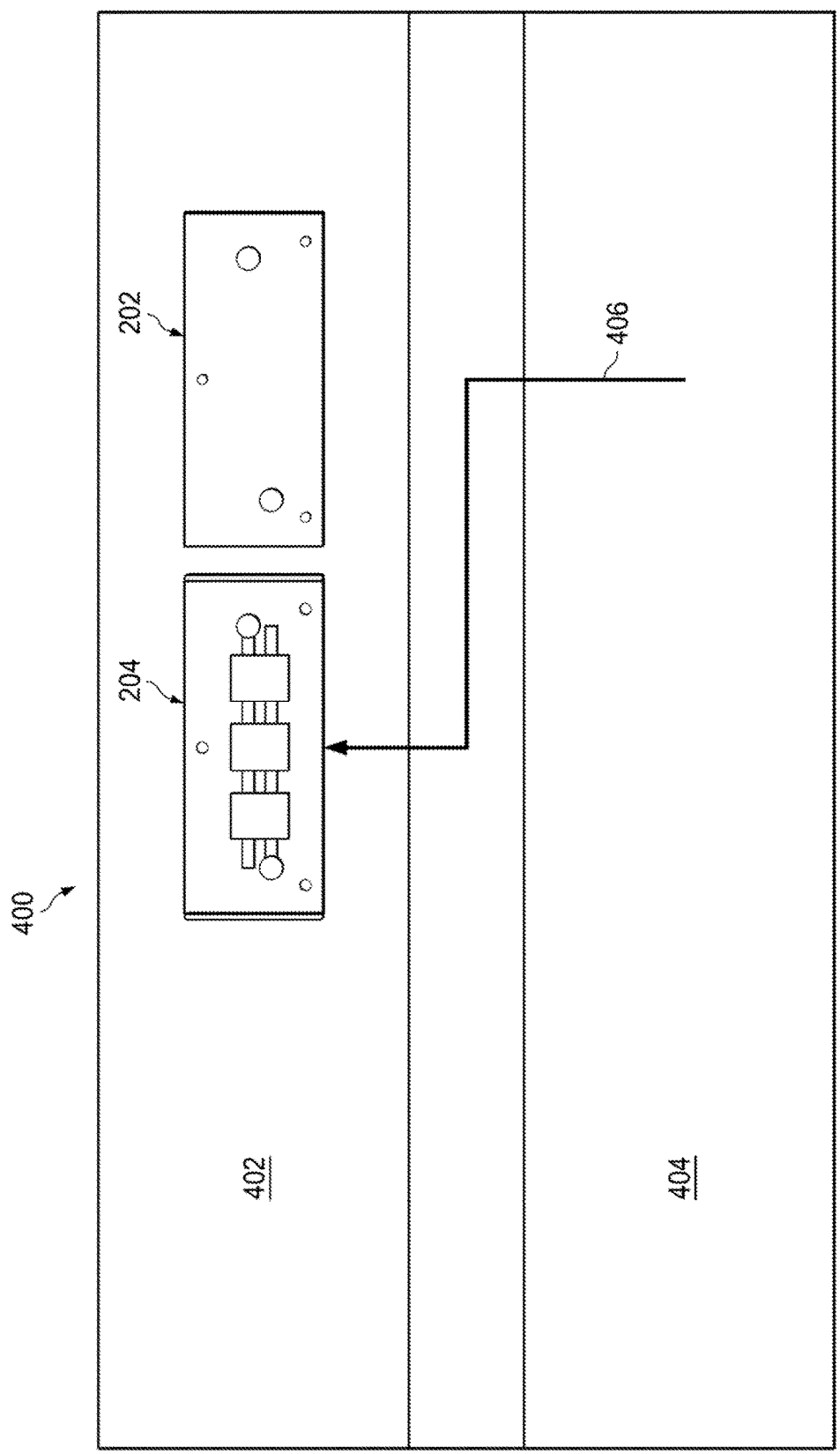
Figure 5:
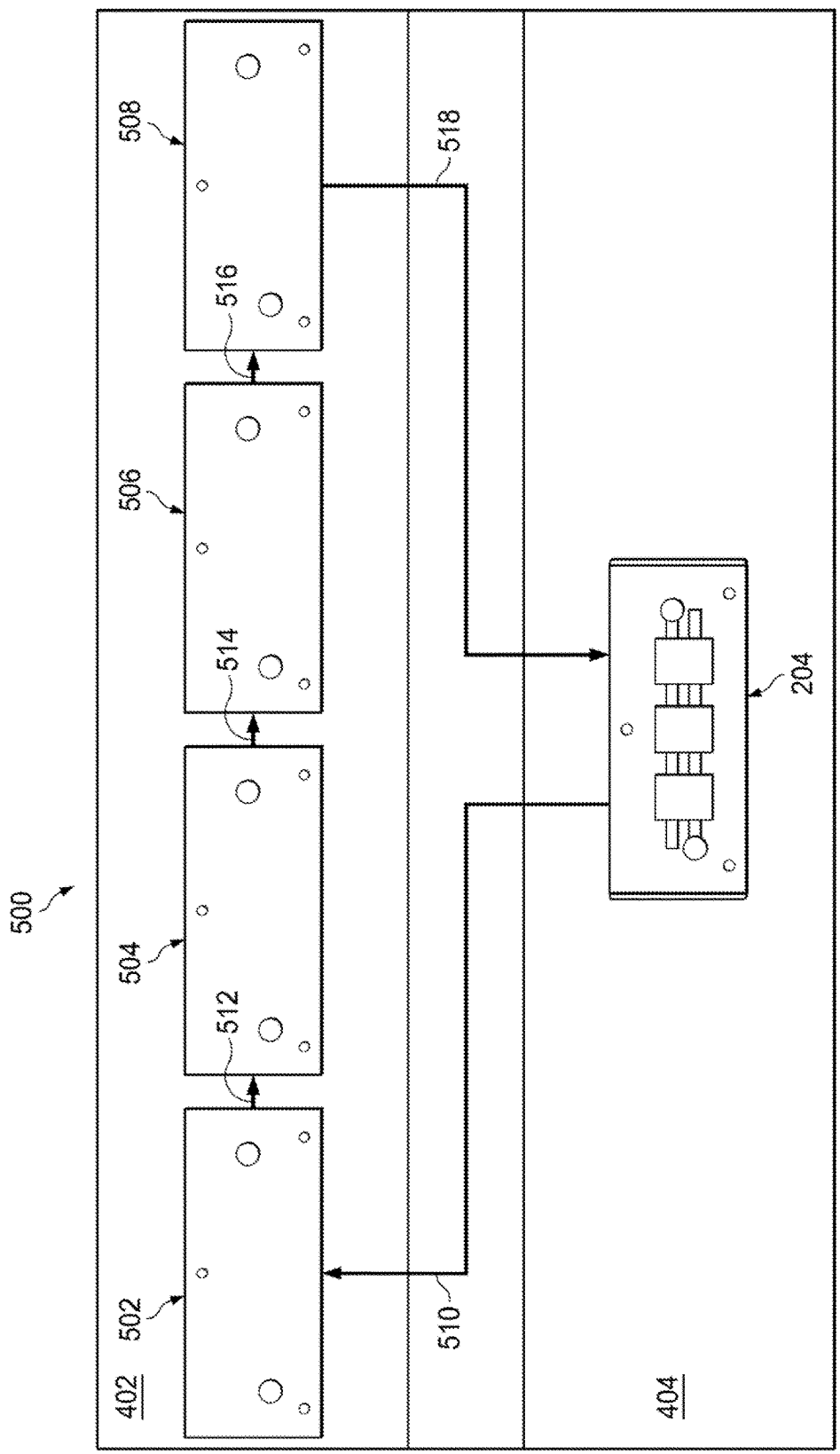
FIG. 5 illustrates a testing environment with multiple docking boards in accordance with aspects of the invention.

The operation of the two piece test fixture of FIG. 2 will now be further described with additional reference to FIGS. 3-5.

FIG. 3 illustrates an example method 300 of operating the two piece test fixture of FIG. 2 in accordance with aspects of the invention.

As shown in the figure, method 300 starts (S302) and the chips are mounted (S304). For example, FIG. 4A illustrates a testing environment 400 in accordance with aspects of the invention.

As illustrated in the figure, testing environment 400 includes docking board 202 and chip mounting board 204 of FIG. 2. Testing environment 400 further includes a high voltage area 402 and a low voltage area 404.

High voltage area 402 is the location where docking board 202 of FIG. 2 is located. High voltage area 402 is a station to perform ADS testing. Docking board 202 is located and connected to the testing station which allows a user to perform ADS testing after connecting chip mounting board 204 to docking board 202 without any additional setup. High voltage area 402 is additionally operable to not contain any EDS safety measures such as a grounded floor, grounded wrist strips, or discharge mats.

Low voltage area 404 is operable to be the location where chips are a mounted and un-mounted onto chip mounting board 204 of FIG. 2. In this example embodiment, low voltage area 404 is the desk of the operator performing the ADS testing. Low voltage area 404 is additionally operable to contain EDS safety measures such as a grounded floor, grounded wrist strips, and discharge mats.

Referring back to FIG. 2, in operation, for purposes of discussion let an operator want to perform a high voltage ADS test on 3 chips. In such a case, the operator will take three chips and chip mounting board 204 to low voltage area 404 of FIG. 4A.

For example, as shown in FIG. 4A, an operator transports chip mounting board 204 to low voltage area 404. Low voltage area 404 contains a grounded floor, grounded wrist straps, and a discharge mat that prevent electrostatic discharges that may build up during the chip mounting process.

Once in low voltage area 404, the operator will place each of the three chips into one of mounting area 220, mounting area 222, and mounting area 224 of chip mounting board 204. Mounting area 220, mounting area 222, and mounting area 224 are arranged such that once each chip is placed, their inputs are in parallel with input bus 236 and their outputs are in parallel with output bus 238.

Returning to FIG. 3, now that the chips have been mounted (S304), the chip mounting board is mounted to the docking board (S306). Once the chips are mounted, chip mounting board 204 is ready to be transported and mounted to docking board 202 in high voltage area 402. The transportation and mounting of chip mounting board 204 will now be further discussed with additional reference to FIG. 4B.

As illustrated. FIG. 4B contains all of the elements of FIG. 4A, and further shows a transportation path 406.

Referring to FIG. 2, once chip mounting board 204 is ready to be transported to high voltage area 402 of FIG. 4B the operator will grab chip mounting board 204 using handle 240 and handle 242. Using each of handle 240 and handle 242 to transport chip mounting board 204 prevents skin oils and other contaminates from getting on chip mounting board 204 and interfering with future testing.

Next, the operator will take transportation path 406 from low voltage area 404, to high voltage area 402. After arriving at high voltage area 402, the operator will align mounting port 230 with mounting element 210, mounting port 232 with mounting element 212, and mounting port 234 with mounting element 214. Once aligned the operator will lower chip mounting board 204 on top of docking board 202 until they are joined together.

Returning to FIG. 3, now that the chip mounting board has been mounted to the docking board (S306), the samples are connected to the input and output lines (S308). As shown in FIG. 2, mounting element 210, mounting element 212, and mounting element 214 are arranged on docking board 202 such that when chip mounting board 204 is lowered input port 226 is aligned and electrically connected with input connector 206 and output port 228 is aligned and electrically connected with output connector 208. Additionally, since each of mounting element 210, mounting element 212, and mounting element 214 are asymmetrically placed on docking board 202, chip mounting board 204 can only be connected one way. This prevents the operator from accidentally connecting input connector 206 to output port 228 and output connector 208 to input port 226. Since input line 216 is connected to input connector 206 and output line 218 is connected to output connector 208, there is no need to perform any additional wiring or preparation of samples. The test samples being connected to input line 216, via input connector 206 and input port 226, and output line 218, via output connector 208 and output port 228.

Returning to FIG. 3, now that the samples are connected to the input and output lines (S308), a test is performed (S310). For example, as shown in FIG. 2, once chip mounting board 204 has been connected to docking board 202, the operator can begin running the high voltage ADS test, When one example ADS test is started, a 5.0 kV input signal is sent to input connector 206, via input line 216. Since input connector 206 and input port 226 are electrically connected the input signal is delivered to input bus 236.

As described above, each chip placed in chip mounting area 220, chip mounting area 222, and chip mounting area 224 are in parallel with input bus 236 and output bus 238. The 5.0 kV input signal is delivered to each chip, via bus 236, which each chip then converts into an output signal. The output signals are then transmitted to output port 228, via output bus 238. The output signals can then be output to the operator through output line 218. The 5.0 kV input signal is supplied for a minimum of 40 hours.

After 40 hours, the high voltage ADS test is completed and the chips can be removed from chip mounting board 204. The transportation and un-mounting of chip mounting board 204 will now be further discussed with additional reference to FIG. 4C.

As illustrated, FIG. 4C contains all of the elements of FIG. 4A, and further shows a transportation path 408.

Returning to FIG. 3, now that the test has been performed (S310), the chip mounting board is removed from the docking board (S312). Referring back to FIG. 2, once chip mounting board 204 is ready to be transported to high voltage area 404 of FIG. 4C. Again, the operator will grab handle 240 and handle 242 and unmounts chip mounting board 204 from docking board 202.

Returning to FIG. 3, after chip mounting board is removed from the docking board (S312), it is determined whether a new test is to be performed (S314). In this example, since the operator was instructed to only perform the ADS test (No at S314), the chips will be removed (S316). For example, once un-mounted, the operator will transport chip mounting board 204 from high voltage area 402 to low voltage area 404, via transportation path 408.

Once the operator and chip mounting board 204 are in low voltage area 404, EDS safety measures are once again usable. At this point, the tested chips can be safely removed from chip mounting board 204. After removal, testing is completed, and method 300 stops (S318).

In another example embodiment, an operator may have been instructed to perform a high voltage surge test instead of a high voltage ADS test. The process of performing parallel surge testing is similar to that of parallel ADS testing as described above. Samples are loaded onto chip mounting board 204 in low voltage environment 402. Chip mounting board 204 is then transported to high voltage environment 404 and mounted to docking board 202.

When the surge testing is performed, each chip converts the input signal it receives into an output signal which is then sent to output bus 238. Output bus 238 allows each output signal to remain separate from all of the others. The output signals are then sent to be analyzed by an operator, via output line 218. In this manner, surge testing of multiple samples can be performed in parallel without the loss of failure identification.

FIG. 4 illustrates a testing environment 500 in accordance with aspects of the invention.

As illustrated in the figure, testing environment 500 includes high voltage area 402, low voltage area 404, and chip mounting board 204. Testing environment 500 further includes a docking board 502, a docking board 504, a docking board 506, a docking board 508, path 510, path 512, path 514, path 516, and path 518.

Docking board 502 is operable to be wired to perform a first high voltage test. Docking board 504 is operable to be wired to perform a second high voltage test. Docking board 506 is operable to be wired to perform a third high voltage test. Docking board 508 is operable to be wired to perform a fourth high voltage test.

Path 510 is the path an operator will take to transport chip mounting board 204 from low voltage environment 404 to docking board 502. Path 512 is the path an operator will take to transport chip mounting board 204 from docking board 502 to docking board 504. Path 514 is the path an operator will take to transport chip mounting board 204 from docking board 504 to docking board 506. Path 516 is the path an operator will take to transport chip mounting board 204 from docking board 506 to docking board 508. Path 518 is the path an operator will take to transport chip mounting board 204 from docking board 508 to low voltage environment 404.

In operation, an operator may be instructed to perform four separate tests on the same set of samples. As discussed above with reference to FIG. 3, the operator prepares samples on docking board 204 in low voltage environment 404 (S302 and S304).

Once the samples are ready, an operator will transport docking board 204 from low voltage environment 404 to docking board 502 of high voltage environment 402, via path 510. Again, as shown in FIG. 3, at this time, the operator can attach chip mounting board 204 to docking board 502 (S306).

The process of an operator attaching chip mounting board 204 to docking board 502 is exactly the same as the process of an operator attaching chip mounting board 204 to docking board 202 as described above in FIGS. 2-4C (S308). Once attached, the operator may run the first test (S310).

After the test is completed, the operator can detach chip mounting board 204 from docking board 502 (S312).

Again, as shown in FIG. 3, after the chip mounting board is removed (S312) it is determined whether there is to be additional testing (S314). In this example, there is to be additional testing (Yes at S314).

Since more tests are to be performed, the chip mounting board is mounted to another docking board (return to S306). For example, the operator transports chip mounting board 204 to docking board 504, via path 512. The operator may then attach chip mounting board 204 to docking board 504 and begin the second test. Once finished, the operator may continue transporting chip mounting board 204 to docking board 506, via path 514, to run the third test and docking board 508, via path 516, to run the fourth test. For each additional test that is performed on the same set of samples, method 300 continues until it is determined that no additional tests are to be performed (No at S314).

In this example, after the fourth test has been run, the operator may detach chip mounting board 204 from docking board 508 and then transport it back to low voltage environment 404, via path 518. Once back in low voltage environment 404, the operator may remove the samples from chip mounting board 204 (S316) and begin evaluating the samples. After the chips are removed, testing is completed, and method 300 stops (S318).

In this manner, an operator may perform multiple tests on multiple samples in parallel without having to load and unload each sample before and after each test. Not having to load and unload each sample individually for each successive test creates a much greater throughput. The increased throughput and testing capacity is key in lowering quality assurance costs in a high volume production environment.

A problem with the current system and method for performing high voltage surge and ADS testing is that standard EDS safety equipment creates a safety risk to an operator performing the testing in a high voltage environment. For this reason, no EDS equipment can be used while loading and unloading samples in a high voltage environment. However, without the use of EDS equipment, it is possible for an electrostatic discharge to damage the testing samples being handled.

The invention uses a two piece testing fixture to protect both an operator and the testing samples. The operator can load testing samples onto a chip mounting board using EDS equipment in a low voltage environment. Afterwards, an operator can transport and connect the chip mounting board to a docking board in a high voltage environment without using EDS equipment. After testing has been completed, an operator can transport the chip mounting board back to a low voltage environment to unload the samples safely.

Another problem with the current system and method for performing high voltage surge testing is that testing cannot be performed in parallel, which is problematic when a large number of samples need to be tested.

The invention uses an input bus and an output bus to provide inputs and outputs to test samples. The buses allow high voltage surge testing to be performed in parallel while keeping the signals of each sample separate. This separation preserves failure identification allowing high voltage surge testing to be performed in parallel.

In the drawings and specification, there have been disclosed embodiments of the invention and, although specific terms are employed, they are used in a generic and descriptive sense only and not for purposes of limitation, the scope of the invention being set forth in the following claims.

What is claimed as new and desired to be protected by Letters Patent of the United States is:

1. A system for testing a first chip and a second chip, said system comprising:
    a chip mounting board having a chip mounting area, an input port, an input bus, an output bus, an output port and a mounting port; and
    a docking board having an input connector, an output connector and a mounting element,
    wherein said chip mounting board is operable to be removably mounted upon said docking board such that said mounting element corresponds to said mounting port, said input connector electrically connects with said input port and said output connector electrically connects with said output port,
    wherein said chip mounting area is arranged to receive the first chip and the second chip in parallel connection between said input bus and said output bus.

2. The system of claim 1, wherein said chip mounting board additionally includes a handle attached thereto.

3. The system of claim 2,
    wherein said chip mounting board has a first end and a second end and further includes a second mounting port,
    wherein said mounting port is a first distance from said first end,
    wherein said second mounting port is a second distance from said second end, and
    wherein said first distance is different from said second distance.

4. The system of claim 1,
    wherein said chip mounting board has a first end and a second end and further includes a second mounting port,
    wherein said mounting port is a first distance from said first end,
    wherein said second mounting port is a second distance from said second end, and
    wherein said first distance is different from said second distance.

5. A method of testing a first chip and a second chip, said method comprising:
    mounting the first chip onto a chip mounting area of a chip mounting board having the chip mounting area, an input port, an input bus, an output bus, an output port and a mounting port;
    mounting the second chip onto the chip mounting board such that the first chip and the second chip are in parallel connection between the input bus and the output bus;
    connecting an input line to an input connector of a docking board having the input connector, an output connector and a mounting element;
    connecting an output line to the output connector of the docking board;
    mounting the chip mounting board upon the docking board such that the mounting element corresponds to the mounting port, the input connector electrically connects with the input port and the output connector electrically connects with the output port;
    supplying an input signal to the input line so as to provide a dielectric stress test to the first chip and the second chip;
    removing the chip mounting board from the docking board after completion of the dielectric stress test;
    removing the first chip from the chip mounting board; and
    testing a parameter of the first chip.

6. The method of claim 5, wherein said supplying the input signal comprises supplying at least 5.0 kV.

7. The method of claim 6, wherein said supplying the at least 5.0 kV comprises supplying the at least 5.0 kV for at least 40 hours.

8. The method of claim 5, wherein said supplying the input signal comprises supplying a first plurality of positive voltage pulses followed by a second plurality of negative pulses.

9. The method of claim 8,
    wherein the first plurality comprises 25 positive pulses, and
    wherein the second plurality comprises 25 negative pulses.

10. The method of claim 5, further comprising:
    connecting a second input line to a second input connector of a second docking board having the second input connector, a second output connector and a second mounting element;
    connecting a second output line to the second output connector of the second docking board;
    mounting the chip mounting board upon the second docking board such that the second mounting element corresponds to the mounting port, the second input connector electrically connects with the input port and the second output connector electrically connects with the output port;

supplying a second input signal to the second input line so as to provide a second dielectric stress test to the first chip and the second chip; and removing the chip mounting board from the second docking board after completion of the second dielectric stress test.

11. The method of claim 10, wherein said supplying the input signal comprises supplying at least 5.0 kV.

12. The method of claim 10, wherein said supplying the second input signal comprises supplying at a first plurality of positive voltage pulses followed by a second plurality of negative pulses.

13. The method of claim 11, wherein said supplying the at least 5.0 kV comprises supplying the at least 5.0 kV for at least 40 hours.

14. The method of claim 13, wherein said supplying the second input signal comprises supplying at a first plurality of positive voltage pulses followed by a second plurality of negative pulses.

15. The method of claim 14,
wherein the first plurality comprises 25 positive pulses, and
wherein the second plurality comprises 25 negative pulses.

16. The method of claim 14,
wherein the first plurality comprises 25 positive pulses, and
wherein the second plurality comprises 25 negative pulses.

17. A method of testing a first chip and a second chip, said method comprising:
mounting the first chip onto a chip mounting area of a chip mounting board having the chip mounting area, an input port, an input bus, an output bus, an output port and a mounting port;
mounting the second chip onto the chip mounting board such that the first chip and the second chip are in parallel connection between the input bus and the output bus;
mounting the chip mounting board upon a docking board such that the chip mounting board is electrically connected to the docking board;
supplying an input signal to the docking board that electrically connects to the chip mounting board so as to provide a dielectric stress test to the first chip and the second chip;

removing the chip mounting board from the docking board after completion of the dielectric stress test.

18. The method of claim 17, further including removing the first chip from the chip mounting board after completion of the stress test.

19. The method of claim 17, further including testing a parameter of the first chip after completion of the stress test.

20. The method of claim 17, further including
removing the first chip from the chip mounting board after completion of the stress test; and
testing a parameter of the first chip after completion of the stress test.

21. The method of claim 17, wherein said supplying the input signal comprises supplying at least 5.0 kV.

22. The method of claim 21 wherein said supplying the at least 5.0 kV comprises supplying the at least 5.0 kV for at least 40 hours.

23. The method of claim 17, wherein said supplying the input signal comprises supplying a first plurality of positive voltage pulses followed by a second plurality of negative pulses.

24. The method of claim 23,
wherein the first plurality comprises 25 positive pulses, and
wherein the second plurality comprises 25 negative pulses.

25. The method of claim 17, wherein the first and second chips are mounted onto the chip mounting area when the chip mounting area is in a low voltage environment that includes electrostatic discharge (ESD) safety measures including at least one of a ground floor, grounded wrist strips, and discharge mats.

26. The method of claim 17, wherein the docking board is in a high voltage environment devoid of electrostatic discharge (ESD) safety measures including at least one of a ground floor, grounded wrist strips, and discharge mats.

27. The method of claim 17, wherein the dielectric stress test comprises at least an electrical surge test.

28. The method of claim 17, wherein the dielectric stress test comprises at least an Accelerated dielectric Testing (ADS) test.

29. The method of claim 17, wherein the dielectric stress test comprises at least an electrical surge test and an Accelerated dielectric Testing (ADS) test.

* * * * *